(12) United States Patent
Chang et al.

(10) Patent No.: US 8,901,655 B2
(45) Date of Patent: Dec. 2, 2014

(54) DIODE STRUCTURE FOR GATE ALL AROUND SILICON NANOWIRE TECHNOLOGIES

(71) Applicant: International Business Machines Corporation, Armonk, NY (US)

(72) Inventors: Josephine B. Chang, Mahopac, NY (US); Isaac Lauer, Yorktown Heights, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/969,820

(22) Filed: Aug. 19, 2013

(65) Prior Publication Data

US 2014/0217509 A1 Aug. 7, 2014

Related U.S. Application Data

(63) Continuation of application No. 13/761,453, filed on Feb. 7, 2013.

(51) Int. Cl.
*H01L 27/12* (2006.01)
*H01L 27/13* (2006.01)
*H01L 29/86* (2006.01)
*B82Y 99/00* (2011.01)

(52) U.S. Cl.
CPC ............. *H01L 27/1203* (2013.01); *B82Y 99/00* (2013.01); *Y10S 977/762* (2013.01); *Y10S 977/938* (2013.01)
USPC ............ 257/347; 257/E29.273; 257/E29.274; 257/350; 977/762; 977/938

(58) Field of Classification Search
CPC ................ H01L 21/823821; H01L 29/66795; H01L 29/785; H01L 27/0924
USPC ............ 257/E29.273, E29.274, 347; 977/762
See application file for complete search history.

(56) References Cited

U.S. PATENT DOCUMENTS 6,835,967 B2  12/2004  Yeo et al.
6,987,289 B2   1/2006  Nowak
(Continued)

OTHER PUBLICATIONS

S. Bangsaruntip et al., "High performance and highly uniform gate-all-around silicon nanowire MOSFETs with wire size dependent scaling," 2009 IEEE International Electron Devices Meeting (IEDM), Dec. 7-9, 2009, pp. 297-300.

*Primary Examiner* — Jerome Jackson, Jr.
*Assistant Examiner* — Paul Budd
(74) *Attorney, Agent, or Firm* — Louis J. Percello; Michael J. Chang, LLC

(57) ABSTRACT

A method of fabricating an electronic device includes the following steps. A SOI wafer is provided having a SOI layer over a BOX. At least one first/second set of nanowires and pads are patterned in the SOI layer. A conformal gate dielectric layer is selectively formed surrounding a portion of each of the first set of nanowires that serves as a channel region of a transistor device. A first metal gate stack is formed on the conformal gate dielectric layer surrounding the portion of each of the first set of nanowires that serves as the channel region of the transistor device in a gate all around configuration. A second metal gate stack is formed surrounding a portion of each of the second set of nanowires that serves as a channel region of a diode device in a gate all around configuration.

7 Claims, 8 Drawing Sheets

(56) References Cited

U.S. PATENT DOCUMENTS

| | | |
|---|---|---|
| 7,432,122 B2 | 10/2008 | Mathew et al. |
| 7,452,778 B2 * | 11/2008 | Chen et al. ............ 438/283 |
| 7,560,784 B2 | 7/2009 | Cheng et al. |
| 7,851,841 B2 * | 12/2010 | Duan et al. ............ 257/296 |
| 7,884,004 B2 | 2/2011 | Bangsaruntip et al. |
| 7,888,775 B2 | 2/2011 | Russ et al. |
| 7,893,492 B2 | 2/2011 | Bedell et al. |
| 7,923,337 B2 | 4/2011 | Chang et al. |
| 8,067,818 B2 * | 11/2011 | Shah et al. ............ 257/618 |
| 2005/0121706 A1 * | 6/2005 | Chen et al. ............ 257/288 |
| 2006/0063334 A1 | 3/2006 | Donze et al. |
| 2010/0295022 A1 | 11/2010 | Chang et al. |
| 2011/0108900 A1 | 5/2011 | Chang et al. |
| 2011/0111596 A1 | 5/2011 | Kanakasabapathy |
| 2011/0133162 A1 | 6/2011 | Bangsaruntip et al. |
| 2011/0193183 A1 | 8/2011 | Agarwal et al. |
| 2012/0007051 A1 | 1/2012 | Bangsaruntip et al. |

* cited by examiner

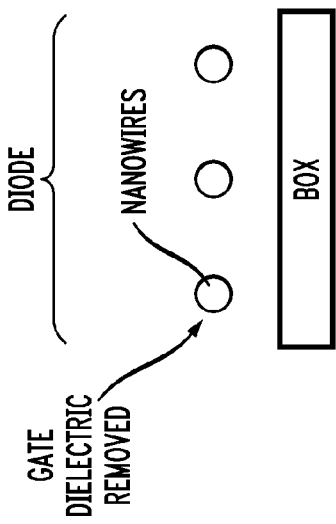
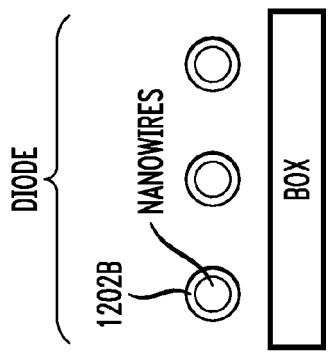
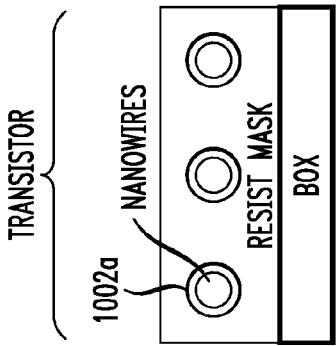
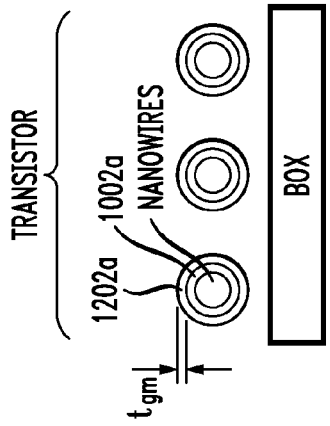

DIODE STRUCTURE FOR GATE ALL AROUND SILICON NANOWIRE TECHNOLOGIES

CROSS-REFERENCE TO RELATED APPLICATION(S)

This application is a continuation of U.S. application Ser. No. 13/761,453 filed on Feb. 7, 2013, the disclosure of which is incorporated by reference herein.

FIELD OF THE INVENTION

The present invention relates to nanowire field-effect transistor (FET)-based electronic devices, and more particularly, to techniques for fabricating nanowire FET diode devices.

BACKGROUND OF THE INVENTION

Non-transistor field effect transistor (FET) elements, such as capacitors and diodes are important elements in complementary metal-oxide semiconductor (CMOS) technology. Much research has been done regarding planar diode and capacitor device structures. See, for example, U.S. Patent Application Publication Number 2011/0108900 A1 filed by Chang et al., entitled "Bi-Directional Self-Aligned FET Capacitor."

However, the use of non-planar devices in future CMOS technologies is becoming increasingly more pervasive. One key issue in the use of these devices is other critical technology elements, such as diodes.

Therefore, solutions for diodes in nanowire FET technologies would be desirable.

SUMMARY OF THE INVENTION

The present invention provides techniques for fabricating nanowire field-effect transistor (FET)-based electronic devices. In one aspect of the invention, a method of fabricating an electronic device is provided. The method includes the following steps. A semiconductor-on-insulator (SOI) wafer is provided having a SOI layer over a buried oxide (BOX). At least one first set of nanowires and pads and at least one second set of nanowires and pads are patterned in the SOI layer, wherein the first set of pads are attached at opposite ends of the first set of nanowires in a ladder-like configuration and wherein the second set of pads are attached at opposite ends of the second set of nanowires in a ladder-like configuration. A conformal gate dielectric layer is selectively formed surrounding a portion of each of the first set of nanowires that serves as a channel region of a transistor device. A first metal gate stack is formed on the conformal gate dielectric layer surrounding the portion of each of the first set of nanowires that serves as the channel region of the transistor device in a gate all around configuration. A second metal gate stack is formed surrounding a portion of each of the second set of nanowires that serves as a channel region of a diode device in a gate all around configuration.

In another aspect of the invention, an electronic device is provided. The electronic device includes, a SOI wafer having a SOI layer over a BOX, at least one first set of nanowires and first set pads patterned in the SOI layer, and at least one second set of nanowires and second set of pads patterned in the SOI layer, wherein the first set of pads are attached at opposite ends of the first set of nanowires in a ladder-like configuration and wherein the second set of pads are attached at opposite ends of the second set of nanowires in a ladder-like configuration; a conformal gate dielectric layer surrounding a portion of each of the first set of nanowires that serves as a channel region of a transistor device; a first metal gate stack on the conformal gate dielectric layer surrounding the portion of each of the first set of nanowires that serves as the channel region of the transistor device in a gate all around configuration; and a second metal gate stack surrounding a portion of each of the second set of nanowires that serves as a channel region of a diode device in a gate all around configuration.

A more complete understanding of the present invention, as well as further features and advantages of the present invention, will be obtained by reference to the following detailed description and drawings.

BRIEF DESCRIPTION OF THE DRAWINGS

FIG. 11A is a cross-sectional diagram illustrating a resist mask having been formed over the nanowires in the channel regions of the nanowire FET transistor device so as to permit selective removal of the gate dielectric from the nanowire FET-diode device (after which the resist mask is removed) according to an embodiment of the present invention;

FIG. 11B is a cross-sectional diagram illustrating the gate dielectric having been selectively removed from the channel regions of the nanowire FET-diode device according to an embodiment of the present invention;

FIG. 12A is a cross-sectional diagram illustrating a conformal gate metal layer(s) having been deposited over the gate dielectric in the channel regions of the nanowire FET transistor device according to an embodiment of the present invention;

FIG. 12B is a cross-sectional diagram illustrating a conformal gate metal layer(s) having been deposited over the nanowires in the channel regions of the nanowire FET-diode device according to an embodiment of the present invention;

DETAILED DESCRIPTION OF PREFERRED EMBODIMENTS

Provided herein are techniques for fabricating large area diodes in gate all around (GAA) nanowire-based devices. Techniques for fabricating diodes in FINFET devices are described for example in U.S. patent application Ser. No. 13/761,430, filed on Feb. 7, 2013, entitled "Diode Structure and Method for FINFET Technologies," the contents of which are incorporated by reference herein. Techniques for fabricating diodes in wire-last nanowire mesh devices are described for example in U.S. patent application Ser. No. 13/761,476, filed on Feb. 7, 2013, entitled "Diode Structure and Method for Wire-Last Nanomesh Technologies," the contents of which are incorporated by reference herein.

The present techniques assume a replacement gate fabrication process flow (also referred to herein as a "gate-last" approach). In a replacement gate or gate-last approach, a dummy gate is formed and then replaced later in the process with a permanent, replacement gate.

The present techniques will be described by way of reference to FIGS. 1-16. In order to illustrate the compatibility of the present techniques with the fabrication of non-diode devices, the following description and related figures will describe/depict the fabrication of a diode and a non-diode device on a common wafer. For instance, the fabrication of a nanowire FET-diode and a regular nanowire FET transistor on a common wafer will be described. It is to be understood however that any combination of diode and non-diode devices (or even simply one or more diode devices alone) may be produced using the present techniques.

The fabrication process begins with a semiconductor-on-insulator (SOI) wafer. See FIG. 1. An SOI wafer typically includes a layer of a semiconductor material (also commonly referred to as a semiconductor-on-insulator layer or SOI layer) separated from a substrate by an insulator. When the insulator is an oxide (e.g., silicon dioxide ($SiO_2$)), it is commonly referred to as a buried oxide, or BOX. According to the present techniques, the SOI layer will serve as an active layer of the device in which nanowires and pads will be patterned.

Figure 1:
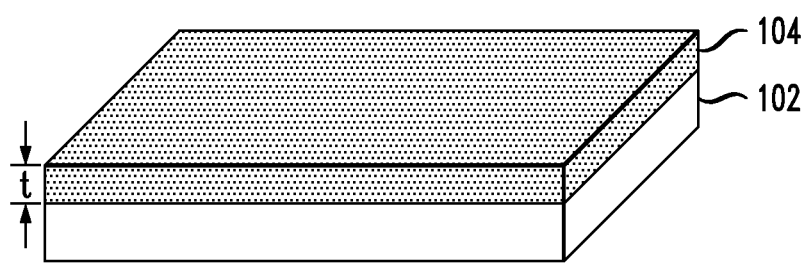
FIG. 1 is a three-dimensional diagram illustrating a semiconductor-on-insulator (SOI) wafer having a SOI layer over a buried oxide (BOX) which is a starting platform for fabrication of gate-all-around nanowire field effect transistor (FET) transistor and diode devices according to an embodiment of the present invention.

In the example shown in FIG. 1, the starting wafer includes an SOI layer 104 over a BOX 102. For ease of depiction, a substrate typically located below the BOX 102 is not shown. SOI layer 104 is formed from a semiconductor material, such as silicon (Si) (e.g., crystalline silicon), silicon germanium (SiGe) or silicon carbon (SiC).

According to an exemplary embodiment, SOI layer 104 has a thickness t of from about 5 nanometers (nm) to about 40 nm. Commercially available SOI wafers commonly have a thicker SOI layer. Thus, the SOI layer of a commercial wafer can be thinned using techniques such as oxidative thinning to achieve the desired active layer thickness for the present techniques.

Nanowires (and pads) will be patterned in the SOI layer 104. In the example shown illustrated in the figures, one nanowire FET-diode and one nanowire FET transistor will be fabricated on the wafer. In this example, one set—i.e., a first set, of the nanowires (and pads) will be used to form the nanowire FET transistor device and another set—i.e., a second set, of the nanowires (and pads) will be used to form the nanowire FET-diode. As provided above, this example is merely being provided to illustrate how the present process can be used to easily and selectively fabricate both types of devices on the same wafer. Of course, the same techniques can be used to produce multiple nanowire FET-diodes and/or multiple transistors.

Figure 2:
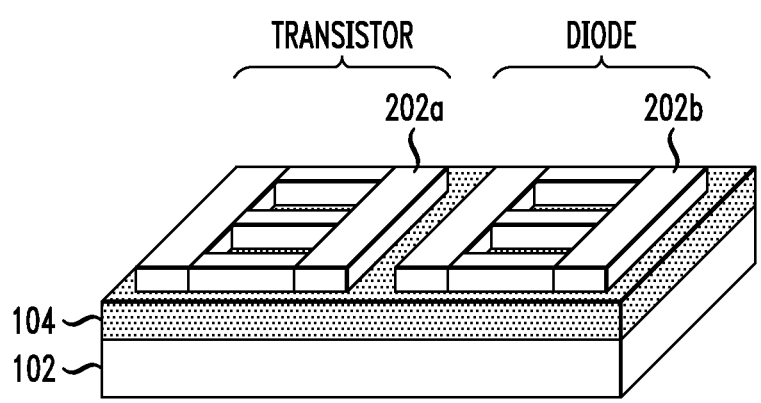
FIG. 2 is a three-dimensional diagram illustrating nanowire hardmasks corresponding to the nanowire FET transistor and diode devices having been formed on the SOI layer according to an embodiment of the present invention.

Patterning of the nanowires (and pads) in the SOI layer 104 is now described. As shown in FIG. 2, standard lithography and etching techniques are used to form hardmasks 202a/202b which will be used to pattern the (first and second sets of) nanowires and pads for the nanowire FET-diode/nanowire FET transistor, respectively, in the SOI layer 104. These hardmasks are also referred to herein as nanowire/pad lithography hardmasks. By way of example only, hardmasks 202a/202b can be formed by blanket depositing a suitable hardmask material (e.g., a nitride material, such as silicon nitride (SiN)) over the SOI layer 104 and then patterning the hardmask material using a standard photolithography process with the footprint and location of the hardmasks 202a/202b. By way of another example (not shown), a soft mask (e.g., resist) can also be used to pattern the nanowires and pads in the SOI layer 104.

As shown in FIG. 2, the nanowire/pad hardmasks 202a/202b each have a ladder-like configuration. This ladder-like configuration will be transferred to the SOI layer 104, wherein the nanowires will be patterned like rungs of a ladder interconnecting the pads.

Figure 3:
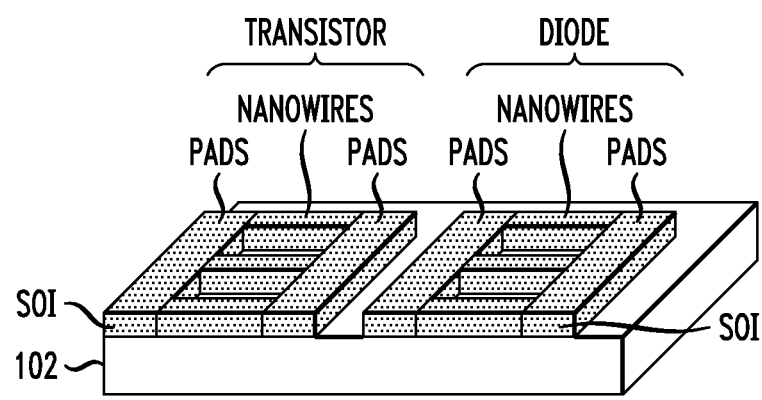
FIG. 3 is a three-dimensional diagram illustrating the hardmasks having been used to pattern (e.g., a first and a second set of) nanowires and pads in the SOI layer and the hardmasks having been removed according to an embodiment of the present invention.
Figure 4:
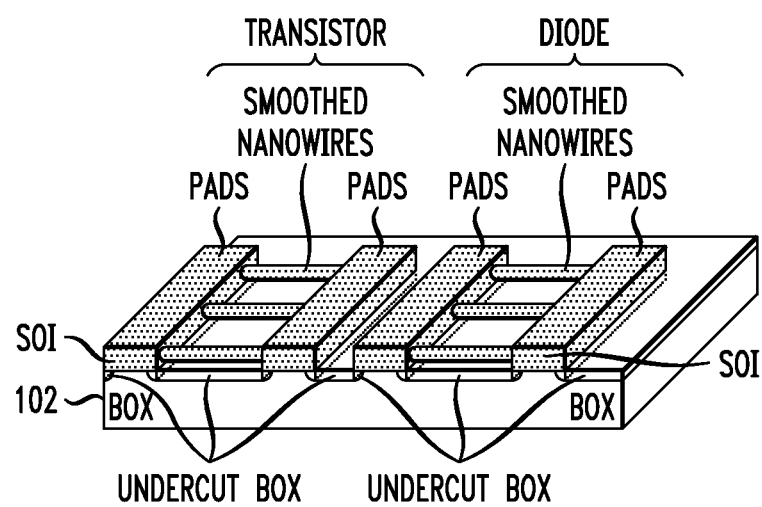
FIG. 4 is a three-dimensional diagram illustrating the nanowires having been suspended over the BOX by undercutting the BOX beneath the nanowires, and the nanowires having been smoothed in both the nanowire FET transistor and diode devices according to an embodiment of the present invention.
Figure 5:
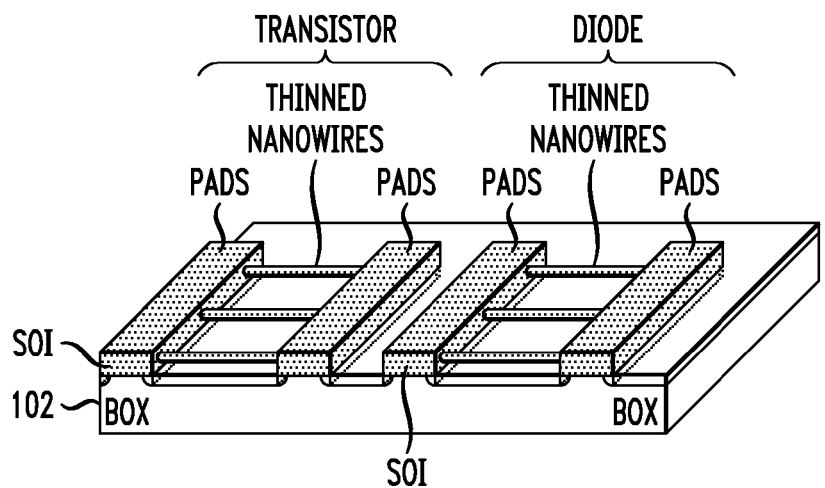
FIG. 5 is a three-dimensional diagram illustrating the nanowires having been thinned in both the nanowire FET transistor and diode devices according to an embodiment of the present invention.
Figure 6:
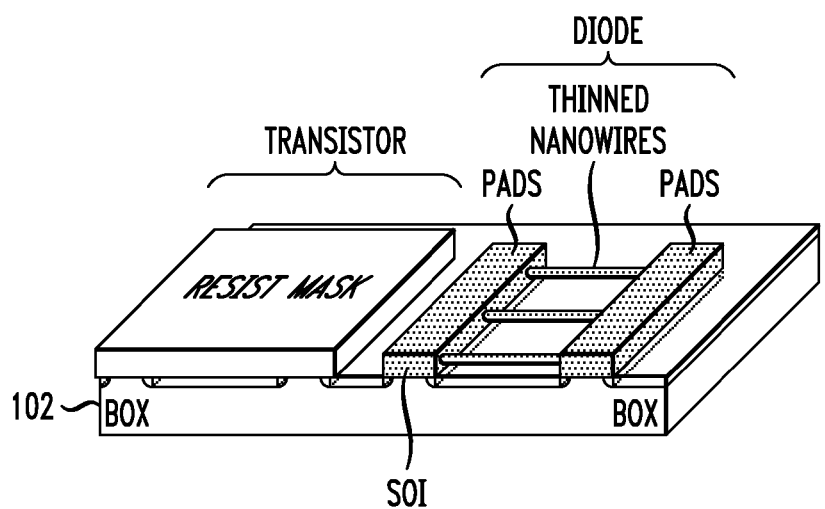
FIG. 6 is a three-dimensional diagram illustrating a resist mask having been formed covering/masking the nanowires and pads of the nanowire FET transistor to permit selective doping of the nanowires and pads of the diode device (after which the resist mask is removed) according to an embodiment of the present invention.
Figure 7:
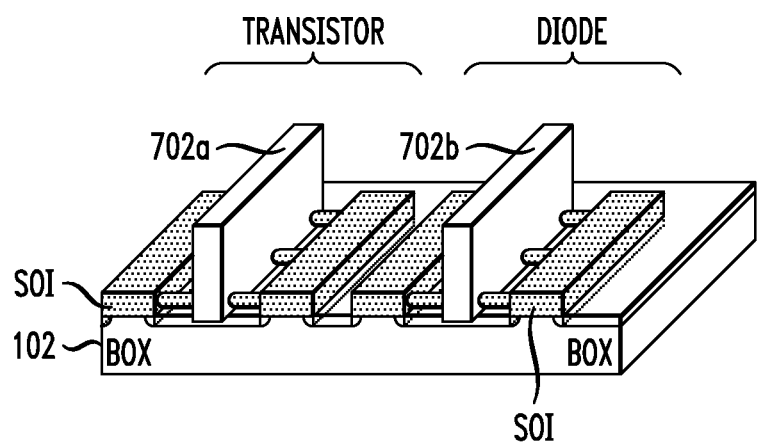
FIG. 7 is a three-dimensional diagram illustrating dummy gates having been formed on a portion of the nanowires that will serve as channel regions of the nanowire FET transistor and diode devices according to an embodiment of the present invention.

An etch through the hardmasks 202a/202b is then used to form the (first and second sets of) nanowires and pads in the SOI layer 104. See FIG. 3. According to an exemplary embodiment, this etch is performed using reactive ion etching (RIE). For example, this RIE step may be performed using a fluorine-containing, e.g., $CHF_3/CF_4$, or bromine chemistry. As shown in FIG. 3, the nanowires and pads are formed having a ladder-like configuration. Namely, the pads are attached at opposite ends of the nanowires like the rungs of a ladder. The hardmasks 202a/202b may now be removed using a selective wet etch process.

In order to permit gate all around (GAA) device configurations, the nanowires are then suspended over the BOX. See FIG. 4. In a GAA configuration, the gate completely surrounds a portion of each of the nanowires that serves as a channel region of the device. According to an exemplary embodiment, the nanowires are suspended by undercutting the BOX 102 beneath the nanowires using an isotropic etching process. This process also laterally etches portions of the BOX 102 under the pads. See FIG. 4. The isotropic etching of the BOX 102 may be performed, for example, using a diluted hydrofluoric acid (DHF). A 100:1 DHF etches approximately 2 nm to 3 nm of BOX layer 102 per minute at room temperature.

Following the isotropic etching of the BOX 102 the nanowires are preferably smoothed to give them an elliptical and in some cases a circular cross-sectional shape. The smoothing of the nanowires may be performed, for example, by annealing the nanowires in a hydrogen-containing atmosphere. Exemplary annealing temperatures are from about 600 degrees Celsius (° C.) to about 1,000° C., and a hydrogen pressure of from about 600 ton to about 700 ton may be employed. Exemplary techniques for suspending and re-shaping nanowires may be found, for example, in U.S. Pat. No. 7,884,004 issued to Bangsaruntip et al., entitled "Maskless Process for Suspending and Thinning Nanowires," the entire contents of which are incorporated by reference herein. During this smoothing process, the nanowires are also thinned. According to one exemplary embodiment, the nanowires at this stage have an elliptical cross-sectional shape with a cross-sectional diameter (equal to the longer axis of the ellipse) of from about 7 nm to about 35 nm.

Optionally, the nanowires can be further thinned. See FIG. 5. As described in conjunction with the description of FIG. 4, above, the nanowires may be re-shaped (e.g., smoothed) to an elliptical (e.g., circular) cross-sectional shape earlier in the process. Now, the nanowires may be further thinned, which also can serve to give them a smoother surface.

By way of example only, the nanowires may be further thinned at this step using a high-temperature (e.g., from about 700° C. to about 1,000° C.) oxidation of the nanowires followed by etching of the grown oxide. The oxidation and etching process may be repeated x number of times to achieve desired nanowire dimensions. According to one exemplary embodiment, the nanowires at this stage after being further thinned have a cylindrical cross-sectional shape with a cross-sectional diameter of from about 2 nm to about 20 nm, e.g., from about 3 nm to about 10 nm.

According to an exemplary embodiment, the nanowires of the diode device(s) are now selectively doped, e.g., with either an n-type or p-type dopant. This process is selective in the sense that the nanowires in the transistor device(s) will remain undoped. To achieve this selective doping, according to an exemplary embodiment, standard lithography and etching techniques are used to pattern a resist mask over the transistor devices, covering and masking the transistor devices, such that the transistor devices receive no doping. This mask is shown schematically in FIG. 6. The (second set of) nanowires (and pads) are then selectively doped. The resist mask can then be removed. Suitable n-type dopants include, but are not limited to, phosphorus and arsenic, and suitable p-type dopants include, but are not limited to, boron.

Following patterning of the nanowires and pads (and selective doping of the nanowires in the diode device(s)), dummy gates 702a and 702b are formed for each of the nanowire devices covering a portion of the nanowires which will serve as channel regions of the nanowire FET-diode and transistor FET devices. See FIG. 7. According to an exemplary embodiment, the dummy gates 702a and 702b are formed from polycrystalline silicon (polysilicon). By way of example only, the dummy gates 702a and 702b may be formed by first depositing a polysilicon layer over the nanowires (using, e.g., low pressure chemical vapor deposition (LPCVD)). A resist is then deposited on the polysilicon layer, masked and patterned with the footprint and location of each of the dummy gates 702a and 702b. Polysilicon-selective RIE is then used to remove all but portions of the polysilicon centrally located over the nanowires, which are the dummy gates 702a and 702b.

Figure 8:
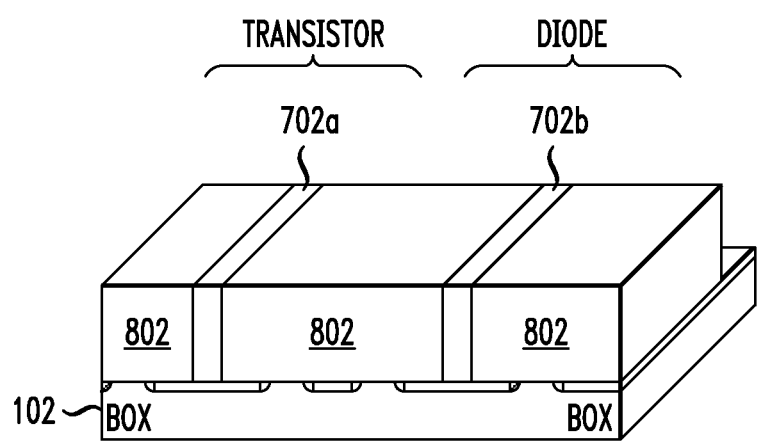
FIG. 8 is a three-dimensional diagram illustrating a filler layer having been deposited around each of the dummy gates according to an embodiment of the present invention.

Next, as shown in FIG. 8, a filler layer 802 is deposited around the dummy gates 702a and 702b. The filler layer 802 can be formed from any suitable filler material, including but not limited to, a dielectric such as silicon dioxide ($SiO_2$). According to an exemplary embodiment, the filler layer 802 is deposited around the dummy gates using a high-density plasma (HDP). Chemical-mechanical polishing (CMP) is then used to planarize the filler material using the dummy gates as an etch stop.

Figure 9:
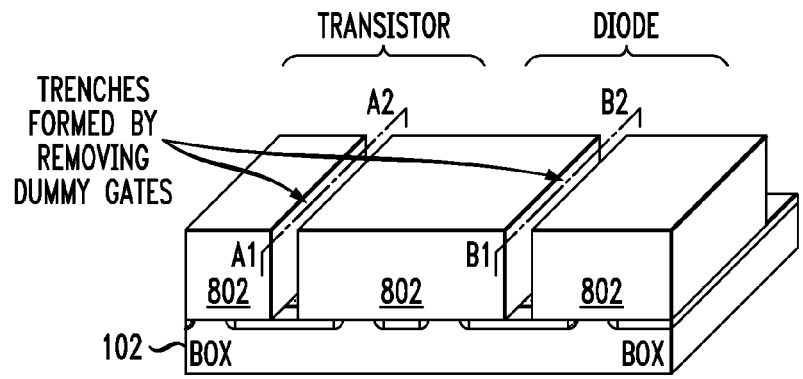
FIG. 9 is a three-dimensional diagram illustrating the dummy gates having been removed, leaving trenches in the filler layer according to an embodiment of the present invention.

Next, as shown in FIG. 9, the dummy gates 702a and 702b are removed, leaving trenches in the filler layer 802. The dummy gates can be removed using wet chemical etching or dry etching. Removal of the dummy gates will expose a portion of the nanowires in each of the devices. As provided above, the dummy gates 702a and 702b were formed over portions of the nanowires which will serve as channel regions of the respective devices. Thus, the portions of the nanowires now exposed in the trenches (after removal of the dummy gates) are the channel regions of the respective (transistor and diode) devices. To better illustrate the gate fabrication process, the orientation of the figures will now shift to cross-sectional cuts along the lines A1-A2 and B1-B2 (i.e., cross-sectional cuts through the nanowire channels of the nanowire FET transistor and diode devices, respectively, along a length of the trenches). See FIG. 9.

Figure 10A:
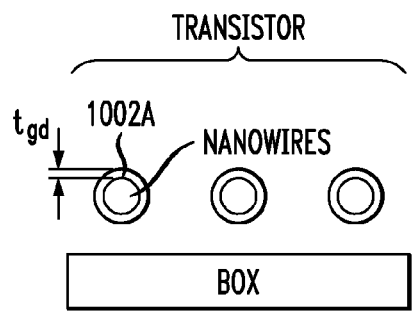
FIG. 10A is a cross-sectional diagram illustrating a gate dielectric having been deposited over the nanowires in the channel regions of the nanowire FET transistor device according to an embodiment of the present invention.
Figure 10B:
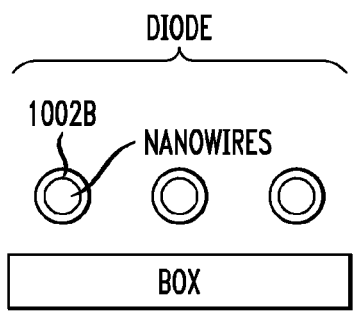
FIG. 10B is a cross-sectional diagram illustrating a gate dielectric having been deposited over the nanowires in the channel regions of the nanowire FET-diode device according to an embodiment of the present invention.

Gate dielectrics 1002a and 1002b are then deposited around the nanowires in the channel regions of the nanowire FET transistor and diode devices, respectively. See FIGS. 10A and 10B. FIG. 10A is a diagram illustrating a cross-sectional cut through the nanowires in the channel region of the nanowire transistor device and FIG. 10B is a diagram illustrating a cross-sectional cut through the nanowires in the channel region of the nanowire diode device. According to an exemplary embodiment, the gate dielectrics 1002a and 1002b are formed from the same material (e.g., a high-k material, such as hafnium oxide or hafnium silicon-oxynitride) that is deposited using a conformal deposition process such as atomic layer deposition (ALD) or chemical vapor deposition (CVD) on the transistor and diode devices concurrently. By way of example only, the gate dielectrics 1002a and 1002b are each deposited (on the respective devices) to a thickness $t_{gd}$ (see FIG. 10A) of from about 1 nm to about 5 nm. Ultimately, the goal will be to have the gate dielectric present only in the nanowire FET transistor devices separating the nanowire channels from the gate. The gate dielectric 1002b will be selectively removed from the nanowire FET-diode devices.

Namely, as shown in FIGS. 11A and 11B, also cross-sectional depictions through the nanowires in the channel regions of the nanowire transistor and diode devices, respectively, standard lithography and etching techniques are used to pattern a resist mask over the transistor device(s) (i.e., thereby protecting the gate dielectric 1002a in the transistor device(s), such that the gate dielectric can remain in the transistor device(s)). The resist mask allows the gate dielectric 1002b to be (selectively) removed from only the diode device(s). This resist mask is shown schematically in FIG. 11A. The gate dielectric 1002b is then removed from the diode devices using a wet etching process—this is feasible if done after the gate dielectric deposition, but prior to any subsequent anneal. The resist mask can then be removed.

Next, as shown in FIGS. 12A and 12B, also cross-sectional depictions through the nanowires in the channel regions of the nanowire transistor and diode devices, respectively, conformal gate metal layers 1202a and 1202b are deposited on the gate dielectric layer 1002a of the transistor device(s) and directly on the nanowires (since the gate dielectric 1002b has been removed from the nanowires—as described above) in the diode device(s), respectively. According to an exemplary embodiment, the gate metal layers 1202a and 1202b are formed from the same material(s) (e.g., a metal(s) such as titanium and/or tantalum, e.g., titanium nitride and/or tantalum nitride) that is deposited on the nanowire FET transistor and diode devices, concurrently. Suitable deposition processes for conformally depositing the gate metal (especially in the case of titanium and tantalum gate metals) include, but are not limited to ALD and CVD. By way of example only, as shown in FIG. 12A, the gate metal layers are deposited to a thickness $T_{gm}$ of (i.e., a uniform thickness across all of the devices) from about 5 nm to about 20 nm. However, it is also possible to deposit gate metal layers 1202a and 1202b separately, if so desired, which would enable tailoring the specific metal(s) employed on a device-type specific basis.

Since the gate metal in the diode will be deposited directly on the nanowires the result will be metal contact to either the n or p nanowire region and forms one terminal of the diode. As will be described below, the gate metal layers may be capped with more gate metal and/or other gate capping layers to complete the gate stacks of the devices. Thus, the completed gate stacks may also be referred to herein generally as a "metal gate stack." It is noted that the portions of the fins extending out from the metal gate stacks serve as source and drain regions of the transistor and diode devices.

Figure 13:
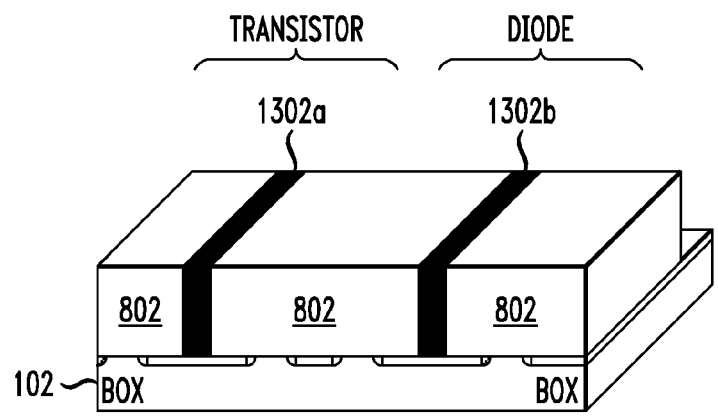
FIG. 13 is a three-dimensional diagram illustrating the gate metal layers having been capped with more gate metal and/or other gate capping layers to complete the gate stacks according to an embodiment of the present invention.
Figure 14:
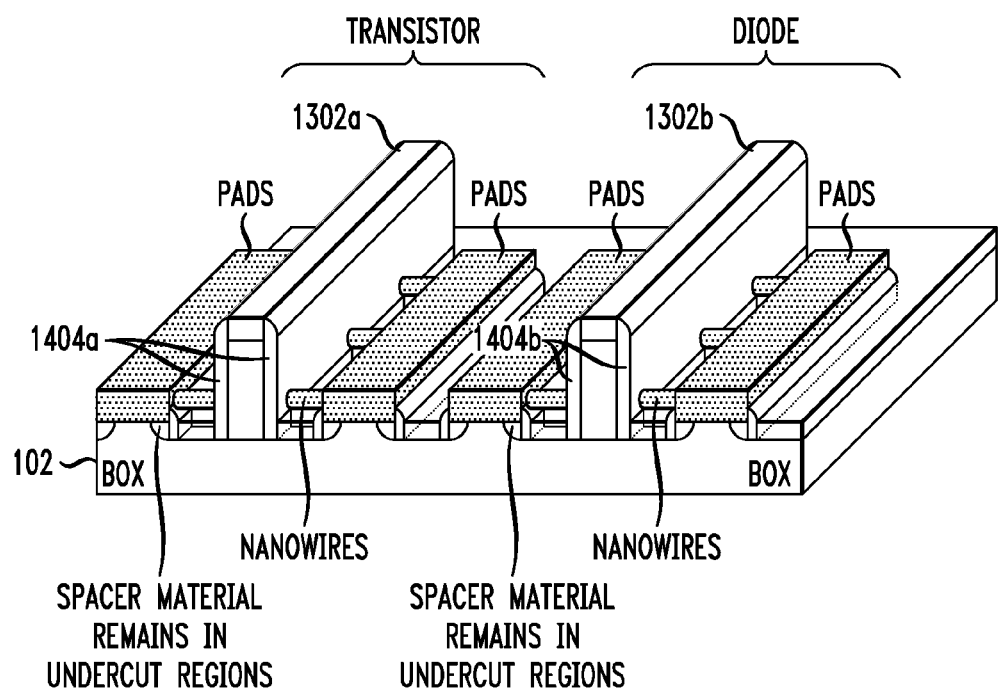
FIG. 14 is a three-dimensional diagram illustrating spacers having been formed on opposite sides of the gate stacks according to an embodiment of the present invention.
Figure 15:
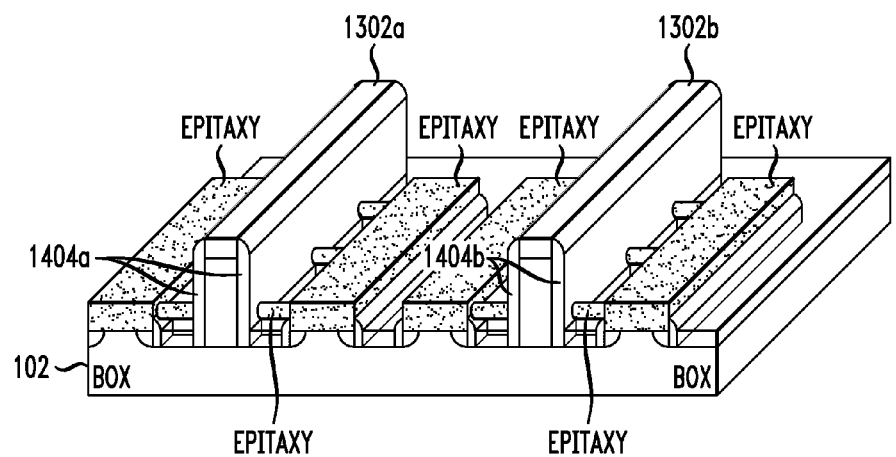
FIG. 15 is a three-dimensional diagram illustrating selective epitaxial growth having been used to thicken the exposed portions of the nanowires and pads (i.e., those portions of the nanowires that are not covered by a gate stack or spacers and the pads—which constitute source and drain regions of the respective devices) according to an embodiment of the present invention.

Switching back to a cross-sectional view of the device, FIG. 13 illustrates the remainder of gate stack formation and patterning. As shown in FIG. 13, the gate metal layers are capped with more gate metal and/or other gate capping layers which may include for example polysilicon, tungsten (W) and/or silicon nitride (SiN) to complete the gate stacks 1302a and 1302b. As provided above, these gate stacks are also referred to herein as "replacement gates" since they replace the dummy gates which were removed earlier in the process.

Following completion of the gate stacks, the filler layer 802 can be removed, for example using a wet etch. Offset spacers (depicted here as 1404a and 1404b) are then formed on opposite sides of the gate stacks 1302a and 1302b, respectively. See FIG. 14. Spacers 1404a and 1404b can be formed by, for example, a conformal deposition of a dielectric material followed by an anisotropic RIE with an overetch long enough to clear the sidewalls of the fins. According to an exemplary embodiment, the offset spacers include silicon nitride (SiN).

Optionally, next a selective epitaxial material (labeled "Epitaxy") such as Si, SiGe, or SiC is then grown to thicken the exposed portions of the nanowires and pads (i.e., those portions not covered by a gate stack or spacers). See FIG. 15. These portions of the nanowires and pads not covered by a gate stack or spacers are the source and drain regions of the devices. The growth process might involve epitaxially growing, for example, in-situ doped Si, SiGe or SiC that may be either n-type or p-type doped. By way of example only, a chemical vapor deposition (CVD) reactor may be used to perform the epitaxial growth. For example, for silicon epitaxy, precursors include, but are not limited to, $SiCl_4$, $SiH_4$ combined with HCL. The use of chlorine allows selective deposition of silicon only on exposed silicon. A precursor for SiGe growth may be $GeH_4$, which may obtain deposition selectivity without HCL. Precursors for dopants may include $PH_3$ or $AsH_3$ for n-type doping and $B_2H_6$ for p-type doping. Deposition temperatures may range from about 550° C. to about 1,000° C. for pure silicon deposition, and as low as 300° C. for pure Ge deposition.

Figure 16:
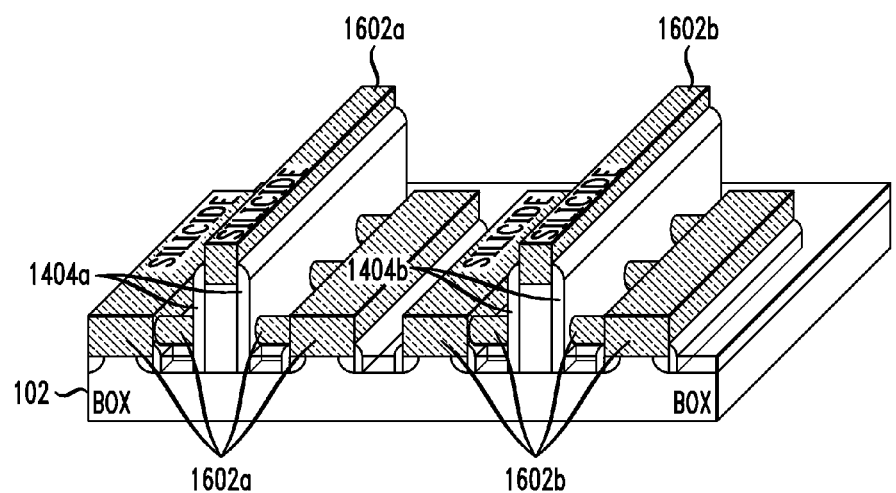
FIG. 16 is a three-dimensional diagram illustrating a contact material having been formed on the exposed epitaxial material according to an embodiment of the present invention.

Finally, a contact material, in this case a silicide 1602a/1602b (formed from the epitaxial Si, SiGe or SiC) is formed on the exposed epitaxial material (i.e., the epitaxial material on the pads and portions of the nanowires that extend out from the gate stack) in both the nanowire transistor and diode devices, respectively. See FIG. 16. Examples of contact materials include, but are not limited to, nickel silicide or cobalt silicide. By way of example only, formation temperatures can be from about 400° C. to about 600° C. As described above, the silicide process involves reacting a deposited metal(s) (such as nickel and/or cobalt) with silicon (e.g., the epitaxial silicon formed in the previous step). As shown in FIG. 16, in this step silicide is also formed on the gate stacks 1302a/1302b to form a gate electrode.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. An electronic device, comprising:
a semiconductor-on-insulator (SOI) wafer having a SOI layer over a buried oxide (BOX), at least one first set of nanowires patterned in the SOI layer and at least one first set of pads patterned in the SOI layer such that the first set of pads are attached at opposite ends of the first set of nanowires in a ladder-like configuration, and at least one second set of nanowires patterned in the SOI layer and at least one second set of pads patterned in the SOI layer such that the second set of pads are attached at opposite ends of the second set of nanowires in a ladder-like configuration;
a conformal gate dielectric layer surrounding a portion of each of the first set of nanowires that serves as a channel region of a transistor device;
a first metal gate stack on the conformal gate dielectric layer surrounding the portion of each of the first set of nanowires that serves as the channel region of the transistor device in a gate all around configuration, and wherein the first set of pads and portions of the first set of nanowires extending out from the first metal gate stack serve as source and drain regions of the transistor device; and
a second metal gate stack surrounding, and in direct contact with, a portion of each of the second set of nanowires that serves as a channel region of a diode device in a gate all around configuration, and wherein the second set of pads and portions of the second set of nanowires extending out from the second metal gate stack serve as source and drain regions of the diode device.

2. The electronic device of claim 1, wherein the second set of nanowires and the second set of pads are doped with an n-type or a p-type dopant.

3. The electronic device of claim 2, wherein the first set of nanowires are undoped.

4. The electronic device of claim 1, wherein the first metal gate stack further comprises a conformal gate metal layer on the conformal gate dielectric layer over the portion of the first set of nanowires that serves as the channel region of the transistor device,
- wherein the second metal gate stack further comprises the conformal gate metal layer directly on the portion of the second set of nanowires that serves as the channel region of the diode device,
- wherein the conformal gate dielectric layer and the conformal gate metal layer conform to a shape of each nanowire in the first set of nanowires such that the conformal gate metal layer and the conformal gate dielectric are present as concentric, circular layers that surround the portion of each of the first set of nanowires that serves as the channel region of the transistor device, and
- wherein the conformal gate metal layer conforms to a shape of each nanowire in the second set of nanowires such that the conformal gate metal layer is present as a concentric, circular layer that surrounds the portion of each of the second set of nanowires that serves as the channel region of the diode device.

5. The electronic device of claim 4, wherein the conformal gate metal layer is capped with a capping layer.

6. The electronic device of claim 1, wherein the BOX is undercut beneath the first set of nanowires and beneath the second set of nanowires.

7. The electronic device of claim 1, further comprising:
an epitaxial material on the source and drain regions of the transistor device and on the source and drain regions of the diode device; and
a contact material on the epitaxial material.

* * * * *